US010254029B2

(12) United States Patent
Stark et al.

(10) Patent No.: US 10,254,029 B2
(45) Date of Patent: Apr. 9, 2019

(54) REFRIGERATION SYSTEM AND COOLING METHOD OF ELECTRONIC CONTROL UNIT THEREOF

(71) Applicant: Carrier Corporation, Jupiter, FL (US)

(72) Inventors: Michael A. Stark, Mooresville, NC (US); Lei Wang, Shanghai (CN); Jianxin Huang, Shanghai (CN); Chaoqun Yan, Shanghai (CN)

(73) Assignee: CARRIER CORPORATION, Farmington, CT (US)

( * ) Notice: Subject to any disclaimer, the term of this patent is extended or adjusted under 35 U.S.C. 154(b) by 0 days.

(21) Appl. No.: 15/399,946

(22) Filed: Jan. 6, 2017

(65) Prior Publication Data

US 2017/0118872 A1 Apr. 27, 2017

Related U.S. Application Data

(63) Continuation-in-part of application No. PCT/US2016/027705, filed on Apr. 15, 2016.

(30) Foreign Application Priority Data

Apr. 15, 2015 (CN) .......................... 2015 1 0176775
Nov. 25, 2016 (CN) .......................... 2016 1 1050248

(51) Int. Cl.
*F25B 49/02* (2006.01)
*F25B 41/06* (2006.01)
*H05K 7/20* (2006.01)

(52) U.S. Cl.
CPC ............ *F25B 49/02* (2013.01); *F25B 41/065* (2013.01); *H05K 7/20* (2013.01); *H05K 7/20154* (2013.01);

(Continued)

(58) Field of Classification Search
None
See application file for complete search history.

(56) References Cited

U.S. PATENT DOCUMENTS 6,116,040 A 9/2000 Stark
6,237,353 B1 5/2001 Sishtla et al.
(Continued)

FOREIGN PATENT DOCUMENTS

CN 204084659 U 1/2015
CN 204115316 U 1/2015
(Continued)

OTHER PUBLICATIONS

International Search Report and Written Opinion for application PCT/US2016/027705, dated Jul. 11, 2016, 10 pages.
(Continued)

*Primary Examiner* — Dimary S Lopez Cruz
*Assistant Examiner* — Zhengfu J Feng
(74) *Attorney, Agent, or Firm* — Cantor Colburn LLP

(57) ABSTRACT

A refrigeration system, including: an electronic control unit, including a housing and an electronic device arranged in the housing; a refrigeration loop, including a compressor, a condenser, a primary throttling element, and an evaporator sequentially connected through a pipeline and forming a closed loop; and an electronic device cooling branch connected into the refrigeration loop from the condenser, and connected back to the refrigeration loop from the evaporator; the electronic device cooling branch including an electronic device cooling unit, a secondary throttling element, and an electromagnetic valve; and the electronic device cooling unit being arranged in the housing and spaced apart from the electronic device, for reducing the temperature and humidity of the electronic device and an environment in the housing.

9 Claims, 1 Drawing Sheet

(52) U.S. Cl.
CPC ..... *H05K 7/20172* (2013.01); *H05K 7/20309* (2013.01); *H05K 7/20318* (2013.01); *H05K 7/20354* (2013.01); *H05K 7/20381* (2013.01); *H05K 7/20936* (2013.01); *F25B 2341/0661* (2013.01); *F25B 2600/11* (2013.01); *F25B 2600/2515* (2013.01); *F25B 2700/02* (2013.01); *F25B 2700/2103* (2013.01); *F25B 2700/2106* (2013.01)

(56) References Cited

U.S. PATENT DOCUMENTS

| | | |
|---|---|---|
| 6,708,521 B2 | 3/2004 | Wurth |
| 7,003,971 B2 | 2/2006 | Kester et al. |
| 8,820,105 B2 | 9/2014 | Norbeck et al. |
| 8,899,052 B2 | 12/2014 | Campbell et al. |
| 8,950,201 B2 | 2/2015 | Voorhis |
| 8,950,206 B2 | 2/2015 | Caillat et al. |
| 2008/0310112 A1 | 12/2008 | Long et al. |
| 2012/0279251 A1 | 11/2012 | Kido et al. |
| 2013/0247607 A1 | 9/2013 | Love et al. |
| 2013/0319038 A1* | 12/2013 | Kawase ............ B60H 1/00278 62/498 |
| 2014/0360215 A1* | 12/2014 | Inaba ................... B60H 1/3207 62/216 |

FOREIGN PATENT DOCUMENTS

| | | | |
|---|---|---|---|
| DE | 102013206996 A1 | 10/2014 | |
| JP | H08316676 A | 11/1996 | |
| JP | 2010147334 A | 7/2010 | |
| JP | WO 2013001829 A1 * | 1/2013 | ............... F24F 1/24 |
| JP | 2013075628 A | 4/2013 | |
| JP | 2013075629 A | 4/2013 | |
| JP | 2015127622 A | 7/2015 | |
| WO | 2013001829 A1 | 1/2013 | |
| WO | 2013039047 A1 | 3/2013 | |
| WO | 2014082177 A1 | 6/2014 | |
| WO | 2014084989 A2 | 6/2014 | |
| WO | 2016168569 A1 | 10/2016 | |

OTHER PUBLICATIONS

European Search Report for application EP 17203639.4, dated Feb. 8, 2018, 7 pages.

* cited by examiner

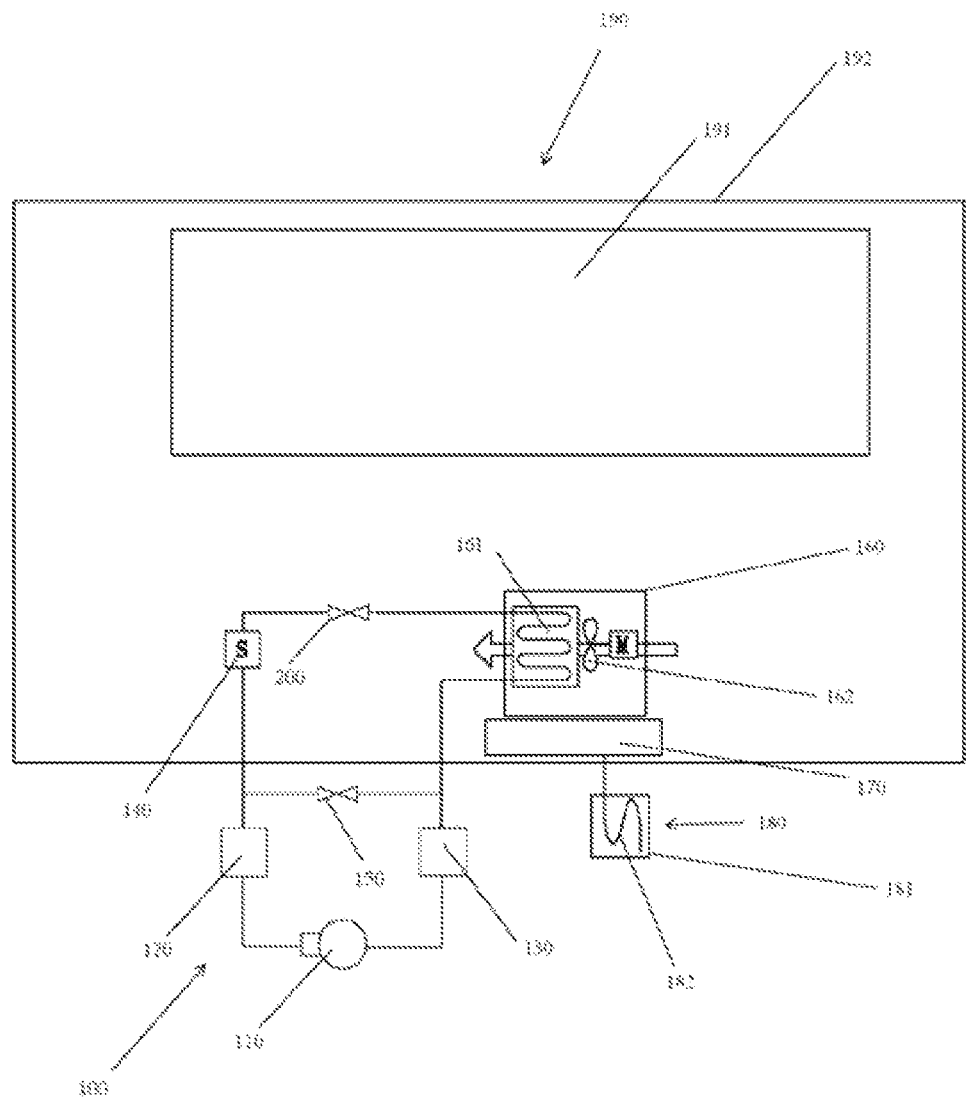

REFRIGERATION SYSTEM AND COOLING METHOD OF ELECTRONIC CONTROL UNIT THEREOF

CROSS-REFERENCE TO RELATED APPLICATIONS

This application is a continuation-in-part of International application number PCT/US2016/027705, filed Apr. 15, 2016, the entire contents of which are incorporated herein by reference, which claims the benefit of Chinese patent application number 201510176775.9, filed Apr. 15, 2015, the entire contents of which are incorporated herein by reference. This application also claims the benefit of Chinese patent application number 201611050248.4, filed Nov. 25, 2016, the entire contents of which are incorporated herein by reference.

TECHNICAL FIELD

The present disclosure relates to a refrigeration system, and in particular, to cooling arrangement of an electronic control device of a refrigeration system and a cooling method thereof.

BACKGROUND ART

A refrigeration system generally requires a special electric control unit, for example, for some large refrigeration systems, the electric control unit may be an inverter starting cabinet. Moreover, electronic devices in the inverter starting cabinet generate more heat, and a greater temperature rise has some influences on the working state thereof. Therefore, it is necessary to cool the electronic devices, to meet performance requirements thereof.

At present, there are already several electronic device cooling modes. For example, a plurality of openings is provided on a housing of an electronic control unit, to cool the electronic device through natural convection or forced convection; for another example, a water-cooled heat exchange device is arranged in the housing, to cool the electronic device by introducing cooling water from an external water source. Therefore, the above electronic device cooling mode may have a problem of relatively low efficiency, or may have a problem that the electronic device in the cabinet fails due to improper dehumidification in a high-temperature and high-humidity environment.

SUMMARY

An aspect of the disclosure is to provide a refrigeration system, which can mitigate a cooling problem inside the entire electronic control unit and reduce the humidity in the housing.

According to an aspect of the present disclosure, a refrigeration system is provided, including: an electronic control unit, including a housing and an electronic device arranged in the housing; a refrigeration loop, including a compressor, a condenser, a primary throttling element, and an evaporator sequentially connected through a pipeline and forming a closed loop; and an electronic device cooling branch connected into the refrigeration loop from the condenser, and connected back to the refrigeration loop from the evaporator; an electronic device cooling unit, a secondary throttling element, and an electromagnetic valve being disposed on the electronic device cooling branch; and the electronic device cooling unit being arranged in the housing and spaced apart from the electronic device, for reducing the temperature and humidity of the electronic device and an environment in the housing.

According to another aspect of the present disclosure, a cooling method for an electronic control unit of a refrigeration system is further provided, including: switching on an electromagnetic valve and a fan in an electronic device cooling unit when it is detected that an ambient temperature in a housing of the electronic control unit is higher than a preset temperature; and/or switching on the electromagnetic valve and the fan in the electronic device cooling unit when it is detected that a dew point temperature corresponding to the ambient humidity in the housing of the electronic control unit is less than the ambient temperature in the housing of the electronic control unit; and/or sending an alarm signal and/or switching off the electromagnetic valve, the fan in the electronic device cooling unit, and a compressor main circuit in a refrigeration loop when it is detected that the dew point temperature corresponding to the ambient humidity in the housing of the electronic control unit is higher than or equal to the ambient temperature in the housing of the electronic control unit.

The refrigeration system according to the present disclosure, by connecting an electronic device cooling unit in parallel to a refrigeration loop, provides a cooling and dehumidification mode for its own electronic control unit, and can effectively cool the entire space in the housing of the electronic control unit and dehumidify the electronic control unit. The structural design not only eliminates a high cost of setting a set of special cooling system but also avoids the problems that the conventional cooling mode of the electronic device is low in efficiency and that the electronic device in the cabinet is easy to fail due to improper dehumidification in a high-humidity environment, and thus the structural design achieves very high practical value and versatility. In addition, the cooling method for an electronic control unit of a refrigeration system according to the present disclosure, according to temperature and/or humidity changes in the electronic control unit, provides corresponding start and stop methods for an electromagnetic valve and a fan, which, in conjunction with the refrigeration system of the present disclosure, better achieves the function of regulating the temperature and humidity of the elements and environment in the electronic control unit.

BRIEF DESCRIPTION OF THE DRAWINGS

FIG. 1 is a schematic diagram of an embodiment of a refrigeration system according to the present disclosure.

DETAILED DESCRIPTION

FIG. 1 illustrates an embodiment of a refrigeration system according to the present disclosure. The refrigeration system 100 includes an electronic control unit 190, and the electronic control unit 190 includes a housing 192 and an electronic device 191 arranged in the housing 192, for providing control over various operations of the refrigeration system 100.

The refrigeration system 100 further has a refrigeration loop of conventional components, that is, a compressor 110, a condenser 120, a primary throttling element 150, and an evaporator 130 sequentially connected through a pipeline. The primary throttling element 150 is mainly used for providing a throttling effect on a refrigerant, and may be a capillary tube having a fixed throttling effect or an electronic expansion valve having an adjustable throttling effect, or other units that can be used for throttling. In addition, the refrigeration system 100 further includes an electronic device cooling branch, where the electronic device cooling branch is connected into the refrigeration loop from the condenser 120, and connected back to the refrigeration loop from the evaporator 130, that is, it is connected in parallel to the primary throttling element 150. An electronic device cooling unit 160, a secondary throttling element 200, and an electromagnetic valve 140 are disposed on the electronic device cooling branch. The electronic device cooling unit 160 is used for cooling the electronic device and reducing humidity of an environment where it is located; the secondary throttling element 200 provides a throttling effect on the refrigerant; and the electromagnetic valve 140 can be used for controlling switching on and switching off of the loop and providing a partial throttling effect on the refrigerant. Specifically, the electronic device cooling unit 160 is spaced apart from the electronic device 191 in the housing 192, thereby cooling the air or other components and parts in the electronic device and the housing 192 at the same time.

The electronic device cooling unit 160 includes an air-refrigerant heat exchanger 161 and a fan 162, and forced convective heat transfer between wind and the refrigerant in the heat exchanger 161 is achieved through the fan 162. Various specification parameters of the heat exchanger 161 in the electronic device cooling unit 160 may be designed by using a general heat exchanger design mode, for example, according to the amount of heat generated by the electronic device. Compared with the existing conventional electronic device cooling mode, the structure of the electronic device cooling unit 160 of the present disclosure and the cooling mode adopted by it bring about a better cooling effect than the conventional direct ventilation cooling, bring about better device reliability than the conventional water cooling, and avoid the problem of potential safety hazards of the electronic device caused by water leakage.

As the heat exchange will inevitably produce condensed water in a cooling and dehumidification process, in order to treat the condensed water in a centralized way, a water pan 170 may be arranged below the electronic device cooling unit 160. Certainly, the water pan 170 may also be replaced with a condensed water collecting device in other forms.

In order to optimize structural layout in the electronic control unit 190, various components and parts are reasonably arranged to improve space utilization. The electronic device cooling unit 160 in this embodiment may be arranged at a lower side close to the housing 192 of the electronic control unit 190, and the water pan 170 is arranged close against an inner side below the housing 192 and is just arranged below the heat exchanger 161, to receive condensed water possibly produced on fins of the heat exchanger 161.

As an optional solution, in order to avoid improving the ambient humidity in the housing 192, the condensed water can be guided out of the housing 192 through a condensed water discharging unit 180 and be treated. In an embodiment, the condensed water discharging unit 180 includes: a drain pipe 182 connected at the bottom of the water pan 170, for guiding the condensed water out of the water pan 170; and a water tank 181 arranged outside the housing 192 and used for receiving the condensed water guided out by the drain pipe 182, to facilitate centralized treatment of the condensed water.

Optionally, the electromagnetic valve 140 and the secondary throttling element 200 may be directly arranged in the housing 192, to avoid excessively compact layout of components and parts outside the electronic control unit.

In addition, in order to better control the opportunity of cooling the electronic control unit 190 by the refrigeration system 100 and to handle the control over switching on and switching off of the electromagnetic valve, the present disclosure further includes a temperature sensor and/or a humidity sensor disposed in the electronic control unit 190, thus controlling switching on and switching off of the electromagnetic valve 140 according to a temperature index and/or a humidity index in the electronic control unit 190.

A better effect will be achieved if this set of refrigeration system is applied to a large refrigeration unit (for example, a centrifugal unit or screw unit). This is because during normal operation, a cooling demand of such an electronic control unit 190 to meet the amount of generated heat is usually between 3 kW and 5 kW, which only accounts for a very small portion in generally hundreds or even thousands of tons of cooling capacity of the large refrigeration unit. Therefore, connecting the electronic device cooling unit 160 in parallel to the large refrigeration unit basically would not affect the work of the original refrigeration system. For example, in this embodiment, the cooling of the electronic control unit 190 is carried out with the cooling capacity carried by only a small portion of the refrigerant in the main refrigeration loop, which not only brings about a better cooling effect than the conventional cooling mode, but also can avoid almost any influence on the work of the main refrigeration loop. This comprehensively achieves improvement of the cooling effect, an increase in the device reliability, a decrease in the system complexity, and so on.

The working process of the present disclosure will be described as follows in combination with the above embodiment. When it is detected that the temperature and/or the humidity index in the housing 192 of the electronic control unit 190 is greater than a certain value, the electromagnetic valve 140 is opened; in this case, the refrigerant, which has been cooled by the condenser 120 and expanded by the electromagnetic valve 140 and the secondary throttling element 200, passes through the air-refrigerant heat exchanger 161, and exchanges heat with an air flow blown by the fan 162. The cooled air flow flows in the whole housing 192, which not only achieves cooling and dehumidification on the electronic device 191, but also achieves regulation and control over the ambient temperature and humidity in the whole housing 192 during the convection, effectively achieving cooling of the electronic device 191 and the environment in the housing 192, and keeping the humidity thereof below a threshold.

The present disclosure further provides an embodiment of a corresponding cooling method for an electronic control unit of a refrigeration system. For example, if the system is controlled according to the temperature, when a main controller in a centrifuge refrigeration system receives an ambient temperature signal in the housing 192 of the electronic control unit 190, the ambient temperature is compared with a built-in preset temperature, and if the ambient temperature is higher than the preset temperature, a control signal is output to open the electromagnetic valve 140 and the fan 162 in the electronic device cooling unit 160. At this point, after passing through the opened electromagnetic valve 140 and being throttled by the secondary throttling element 200, the refrigerant flows to the electronic device cooling unit 160, and exchanges heat with air that flows through the heat exchanger 161 under the driving of the fan, such that the ambient temperature in the whole housing 192 is mitigated and maintained below the preset temperature, thereby avoiding overheating of the electronic control unit.

In addition, if the system is controlled based on both the humidity and the temperature, when the main controller in the centrifuge refrigeration system receives ambient temperature and ambient humidity signals in the housing 192 of the electronic control unit 190, a dew point temperature corresponding to the relative ambient humidity is calculated and compared with the detected ambient temperature: if the calculated dew point temperature is lower than the ambient temperature, a control signal is output to open the electromagnetic valve 140 and the fan 162 in the electronic device cooling unit 160. At this point, after passing through the opened electromagnetic valve 140 and being throttled by the secondary throttling element 200, the refrigerant flows to the electronic device cooling unit 160, and exchanges heat with air that flows through the heat exchanger 161 under the driving of the fan, such that the ambient temperature in the whole housing 192 is improved and maintained above the dew point temperature, thereby avoiding overwetting and condensation of the electronic control unit, and further avoiding the failure thereof; if the calculated dew point temperature is higher than or equal to the detected ambient temperature, an alarm signal or a protection signal is output to remind a user or the electromagnetic valve 140, the fan 162 in the electronic device cooling unit 160, and the compressor main circuit in the refrigeration loop are directly turned off.

Specific implementations of the present disclosure are described in detail as above according to the accompanying drawings. Persons skilled in the art can make equivalent modifications or variations to specific features in the implementations according to the above description. Definitely, these changed implementations will also fall within the protection scope covered by the claims.

The invention claimed is:

1. A refrigeration system, including:
an electronic control unit, including a housing and an electronic device arranged in the housing;
a refrigeration loop, including a compressor, a condenser, a primary throttling element, and an evaporator sequentially connected through a pipeline and forming a closed loop; and
an electronic device cooling branch connected into the refrigeration loop from the condenser, and connected back to the refrigeration loop from the evaporator; the electronic device cooling branch including an electronic device cooling unit, a secondary throttling element, and an electromagnetic valve; and the electronic device cooling unit being arranged in the housing and spaced apart from the electronic device, for reducing the temperature and humidity of the electronic device and an environment in the housing;
wherein the electromagnetic valve and the secondary throttling element are arranged in the housing.

2. The refrigeration system according to claim 1, wherein the electronic device cooling unit includes an air-refrigerant heat exchanger and a fan that provides forced air convection, wherein the air-refrigerant heat exchanger is connected in parallel to the primary throttling element.

3. The refrigeration system according to claim 2, further including a condensed water collecting unit arranged below the air-refrigerant heat exchanger in the housing.

4. The refrigeration system according to claim 3, wherein the condensed water collecting unit is a water pan.

5. The refrigeration system according to claim 3, further including a condensed water discharging unit for discharging condensed water out of the housing, the condensed water discharging unit being arranged outside the housing and in fluidic communication with the condensed water collecting unit.

6. A refrigeration system, including:
an electronic control unit, including a housing and an electronic device arranged in the housing;
a refrigeration loop, including a compressor, a condenser, a primary throttling element, and an evaporator sequentially connected through a pipeline and forming a closed loop; and
an electronic device cooling branch connected into the refrigeration loop from the condenser, and connected back to the refrigeration loop from the evaporator; the electronic device cooling branch including an electronic device cooling unit, a secondary throttling element, and an electromagnetic valve; and the electronic device cooling unit being arranged in the housing and spaced apart from the electronic device, for reducing the temperature and humidity of the electronic device and an environment in the housing;
wherein the primary throttling element is a ball float valve.

7. A refrigeration system, including:
an electronic control unit, including a housing and an electronic device arranged in the housing;
a refrigeration loop, including a compressor, a condenser, a primary throttling element, and an evaporator sequentially connected through a pipeline and forming a closed loop; and
an electronic device cooling branch connected into the refrigeration loop from the condenser, and connected back to the refrigeration loop from the evaporator; the electronic device cooling branch including an electronic device cooling unit, a secondary throttling element, and an electromagnetic valve; and the electronic device cooling unit being arranged in the housing and spaced apart from the electronic device, for reducing the temperature and humidity of the electronic device and an environment in the housing;
wherein the electronic device cooling unit includes an air-refrigerant heat exchanger and a fan that provides forced air convection, wherein the air-refrigerant heat exchanger is connected in parallel to the primary throttling element;
further including a temperature sensor and/or a humidity sensor, the temperature sensor and/or the humidity sensor being arranged in the housing, and the refrigeration system being used for controlling opening or start and stop of the electromagnetic valve and the fan according to a parameter detected by the temperature sensor and/or the humidity sensor.

8. A refrigeration system, including:
an electronic control unit, including a housing and an electronic device arranged in the housing;
a refrigeration loop, including a compressor, a condenser, a primary throttling element, and an evaporator sequentially connected through a pipeline and forming a closed loop; and
an electronic device cooling branch connected into the refrigeration loop from the condenser, and connected back to the refrigeration loop from the evaporator; the electronic device cooling branch including an electronic device cooling unit, a secondary throttling element, and an electromagnetic valve; and the electronic device cooling unit being arranged in the housing and spaced apart from the electronic device, for reducing the temperature and humidity of the electronic device and an environment in the housing;

wherein the compressor is a centrifugal compressor.

9. A refrigeration system, including:
an electronic control unit, including a housing and an electronic device arranged in the housing;
a refrigeration loop, including a compressor, a condenser, a primary throttling element, and an evaporator sequentially connected through a pipeline and forming a closed loop; and
an electronic device cooling branch connected into the refrigeration loop from the condenser, and connected back to the refrigeration loop from the evaporator; the electronic device cooling branch including an electronic device cooling unit, a secondary throttling element, and an electromagnetic valve; and the electronic device cooling unit being arranged in the housing and spaced apart from the electronic device, for reducing the temperature and humidity of the electronic device and an environment in the housing;

wherein the electronic control unit is configured to perform operations comprising:
switching on an electromagnetic valve and a fan in an electronic device cooling unit when it is detected that an ambient temperature in a housing of the electronic control unit is higher than a preset temperature; and/or
switching on the electromagnetic valve and the fan in the electronic device cooling unit when it is detected that a dew point temperature corresponding to the ambient humidity in the housing of the electronic control unit is less than the ambient temperature in the housing of the electronic control unit; and/or
sending an alarm signal and/or switching off the electromagnetic valve, the fan in the electronic device cooling unit, and a compressor main circuit in a refrigeration loop when it is detected that the dew point temperature corresponding to the ambient humidity in the housing of the electronic control unit is higher than or equal to the ambient temperature in the housing of the electronic control unit.

* * * * *